United States Patent [19]

Adam

[11] 4,295,150
[45] Oct. 13, 1981

[54] STORAGE TRANSISTOR

[75] Inventor: Fritz G. Adam, Freiburg, Fed. Rep. of Germany

[73] Assignee: ITT Industries, Inc., New York, N.Y.

[21] Appl. No.: 80,869

[22] Filed: Oct. 1, 1979

[30] Foreign Application Priority Data

Oct. 18, 1978 [DE] Fed. Rep. of Germany ....... 2845328

[51] Int. Cl.³ ...................... H01C 29/78; G11C 11/40
[52] U.S. Cl. ......................................... 357/54; 357/23; 357/41
[58] Field of Search ....................... 357/23, 54, 59, 13, 357/41; 365/185

[56] References Cited

U.S. PATENT DOCUMENTS 4,115,914  9/1978  Harari .................................. 357/23
4,162,504  7/1979  Hsu ..................................... 357/23

OTHER PUBLICATIONS

IEEE Trans. on Electron Devices, vol. ED. 24, No. 5, May 1977, pp. 600-610.

Primary Examiner—William D. Larkins
Attorney, Agent, or Firm—John T. O'Halloran; Peter C. Van Der Sluys

[57] ABSTRACT

A storage transistor includes a semiconductor substrate having formed therein a source region and a drain region spaced from said source region forming a channel region therebetween. A gate electrode is disposed over said channel region and a layer of storage medium has a first portion extending between the channel region and the gate electrode and a second portion extending laterally outside from between the channel region and the gate electrode, the ratio of the area of the second portion to the area of the first portion being in the range of 2 to 3. A first partial gate insulator layer is disposed between the channel region and the layer of storage medium and has a thickness ranging between 100 and 200 A.U., while a second partial gate insulator layer is disposed between the layer of storage medium and the gate electrode and has a thickness in the range of between 200 and 500 A.U. Whereby an erase or write pulse may be applied to the gate electrode for storing or removing a charge into or from the storage medium respectively and thereby displacing the threshold voltage and a read pulse may be applied to the gate electrode for scanning the magnitude of the threshold voltage.

14 Claims, 4 Drawing Figures

A-A

A-A

STORAGE TRANSISTOR

BACKGROUND OF THE INVENTION

1. Field of the Invention

The present invention relates to storage cells and more particularly to a storage transistor.

2. Description of the Prior Art

In the applicant's earlier U.S. patent application Ser. No. 903,359 filed May 5, 1978, there has been proposed a semiconductor storage cell comprising a MI1I2S-field-effect transistor structure and a programming gate electrode in addition to a read gate electrode for permitting the non-volatile storing of an electric charge, and in which, between the two insulator partial layers I1 and I2, there is arranged a continuous storage medium extending throughout the entire widths of the read gate electrode and the programming gate electrode extending in parallel therewith. This semiconductor cell is to be regarded as a parallel arrangement of two field-effect storage transistors having a common source and gate region, as well as a common storage medium between the two insulating storage layers, but with two separate gate electrodes, and, therefore, is known as a tetrode storage cell.

Compared with a conventional MI1I2S-field-effect transistor, the tetrode storage cell according to the earlier proposal offers the possibility of a longer storage time by requiring a shorter programming time and, simultaneously, a lower programming voltage.

SUMMARY OF THE INVENTION

An exact analysis of the tetrode storage cell according to the earlier proposal has shown that also during the reading with the programming gate electrode, suitable threshold voltage windows are obtainable when the surface ratio read gate electrode to programming gate electrode $F_{RM}/F_{PM}$ is chosen sufficiently large, and when using an electrically conducting or semiconducting medium.

In these circumstances, therefore, it is possible to do completely without the read gate electrode when maintaining a corresponding expansion of the storage medium outside the projection of the programming gate electrode, thus safeguarding in a sufficient magnitude the capacitance required for coupling the storage medium to the substrate, which is decisive for the proper functioning. This merely has the disadvantage that one will have to do without the extremely low programming voltages in the range between approximately 8 and 15 V achievable with the tetrode storage cell in the case of very thin insulator layers below the programming gate electrode.

The invention is based on the recognition that in the case of a certain ratio of the surface of the storage medium to that of the read gate electrode, and under certain thickness relationships of the partial layer of the gate insulator layer, the read gate electrode may well take over the function of the programming gate electrode of the semiconductor storage cell according to the earlier proposal, so that the programming gate electrode might be dispensed with resulting without having to lose in a storage cell with only one gate electrode substantial advantages of conventional MI1I2S-storage cells.

It is the object of the invention, therefore, to provide a storage transistor having a MI1I2S-field-effect transistor structure which, compared with conventional MI1I2S-field-effect transistor structures, has a longer storage time by requiring a shorter programming time and, simultaneously, a lower programming voltage.

Accordingly, the invention relates to a storage transistor comprising a gate electrode to which, for storing or removing a charge into or from a storage medium, at the boundary surface of two partial layers of a gate insulator layer on which the gate electrode is arranged, and by displacing the threshold voltage, a write or erase pulse is applied respectively, and via which the magnitude of the threshold voltage is scanned with the aid of a read pulse.

One such storage transistor comprising a storage medium of polycrystalline silicon within a gate insulator layer which, by the storage medium, is subdivided into a first partial layer bordering on the semiconductor surface, and into a second partial layer bordering on the gate electrode, has already become known from the periodical "Solid-State Electronics" (1974), Vol. 17, pp. 517 to 528.

According to the invention, the aforementioned object is achieved by providing a partial layer bordering on the one semiconductor surface of a semiconductor body of silicon, having a thickness ranging between 100 and 200 Å.U. while a partial layer bordering on the gate electrode has a thickness ranging between 200 and 500 Å.U., and the storage medium consists of a layer of a semiconducting material laterally protruding to such an extent over the projection of the effective surface part of the gate electrode onto the storage medium, that the ratio of the surface part of the storage medium projecting over the effective surface part to the effective surface part is between 2 and 3.

Incidentally, the aforementioned object is also achieved with the semiconductor storage cell according to the earlier proposal, employing extremely low programming voltages in the range between approximately 8 and 15 V. For this purpose, however, there is required an additional programming gate electrode, whereas with the storage transistor according to the invention, the same advantages are already achievable by slightly increasing the programming voltages to values ranging between 20 and 25 V.

DESCRIPTION OF THE INVENTION

Figure 1:
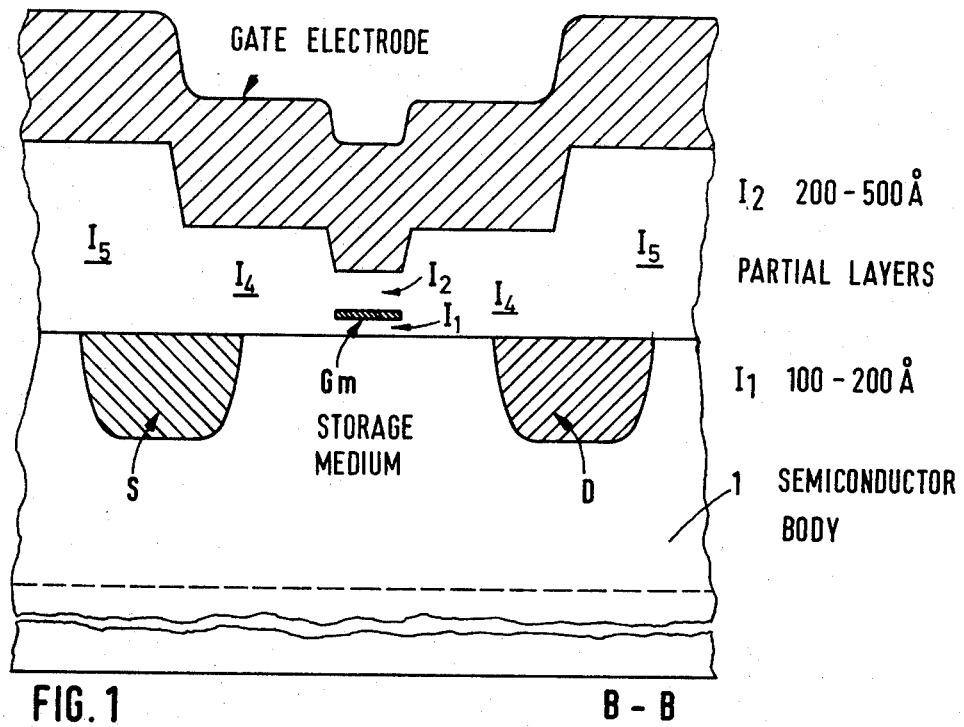
FIG. 1 shows a cross-sectional view taken along the line B—B of FIG. 3 vertically through the source and the drain region of a storage transistor according to the invention.
Figure 3:
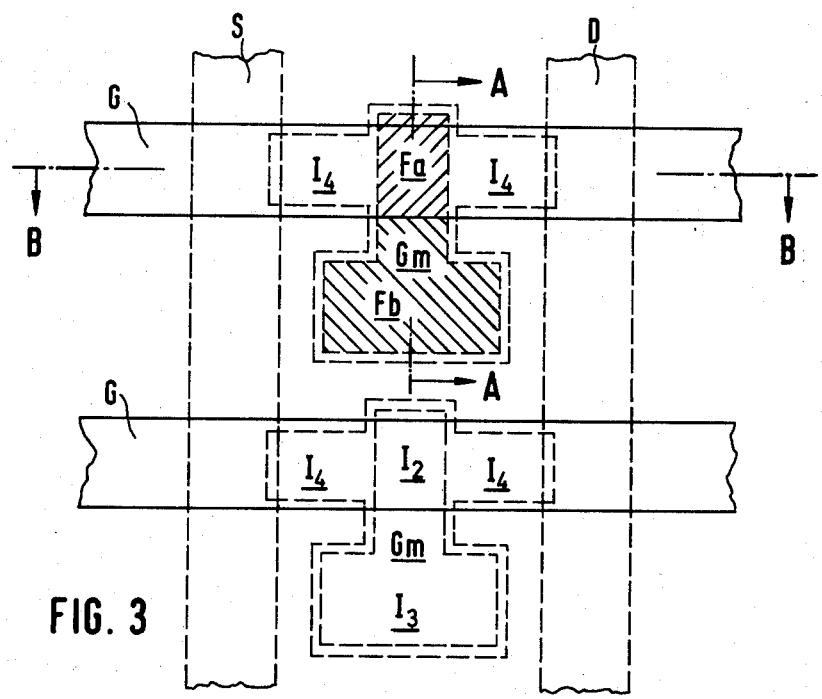
FIG. 3 sectionally shows the top plan view of two storage transistors of a storage matrix.

In FIG. 1, which is a cross-sectional view taken along the line B—B of FIG. 3, the storage medium Gm is shown to be lying between the partial layer I1 adjoining the semiconductor body 1 and the partiak layer I2 adjoining the gate electrode G. The channel region which serves to connect the sorce region S with the drain region D, contains a central active area, because the storage medium Gm merely extends over a central surface area of the channel region. At the outer partial surface areas I4, the gate insulator layer is thickened, for preventing a voltage breakdown in these areas. The outer partial surface areas I4 are followed by the passivating layer I5 having the largest thickness of all layers.

FIG. 3, which sectionally in a top plan view shows two storage transistors according to the ivention arranged within a storage matrix, also shows that the storage medium Gm comprises surface parts laterally protruding over the effective surface parts of the gate electrodes G.

Figure 4:
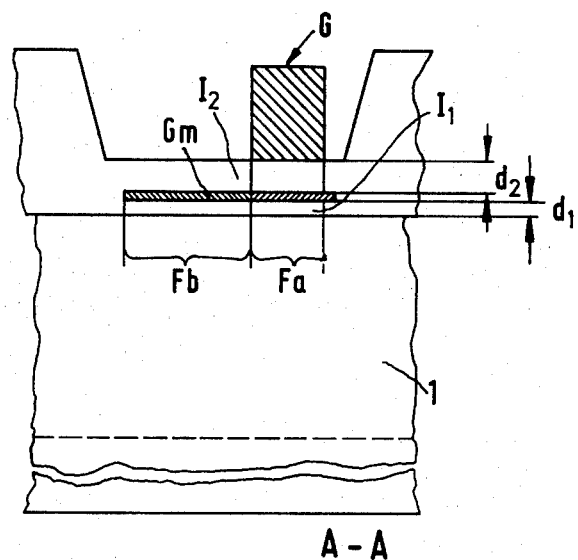
FIG. 4 is the sectional view taken along line A—A of FIG. 3.

FIG. 4 is a sectional view taken along the line A—A of FIG. 3. Within the projection of the effective surface part Fa of the gate electrode G, there is arranged a certain surface proportional Fa of the storage medium Gm, with this proportion being indicated in FIG. 3 by being hatchlined in the one direction. Outside the projection of the effective surface part Fa of the gate electrode G upon the storage medium Gm, there is arranged the surface part Fb laterally protruding from the effective surface part Fa, indicated by being hatchlined in the other direction.

When selecting now a thickness d1 of between 100 and 200 Å.U. for the partial layer I1 adjoining the semiconductor body and a thickness 2 of between 200 and 500 Å.U. for the partial layer I2 adjoining the gate electrode G, as well as a surface ratio of Fb to Fa ranging between 2 and 3, there will be obtained storage transistors having a storage time longer than that of conventional MI1I2S-field-effect transistor structures, but with a short programming time, thus requiring programming voltages ranging between 20 and 25 V.

In the storage matrix which is shown sectionally in a top plan view in FIG. 3, columnwise continuous source regions S and drain regions D are inserted in the semicondutor surfaces either by way of diffusion or ion implantations and, as is also illustrated in FIG. 1, rectangularly in relation thereto, the gate electrodes G are deposited as continuous strips on the passivating layer I5 which, by being stepped, gradually changes over into the gate insulator layers I4 and I2 with I1. The storage medium Gm are deposited subsequently to the deposition of the partial layers I1 adjoining the semicondutor body 1 of silicon, either by way of evaporation or deposition from the gaseous phase.

In the storage transistor according to the example of embodiment, the storage medium Gm extends below the gate electrode G merely through a central surface area of the channel region between the source region S and the drain region D, whereas the parts adjoining both the source region S and the drain region D are covered by a uniform outer gate insulator layer part I4. This outer gate insulator layer part I4, for the purpose of improving the breakdown behavior, preferably has a greater thickness than the central gate insulator layer part I1 and I2 with the storage medium Gm embedded therein. The outer gate insulator layer part I4, for example, may have a uniform thickness in the range between approximately 700 and 2,000 Å.U.

The partial layer I1 of the gate insulator layer as adjoining the semiconductor surface, of course, may also consist of partial layers, and must not absolutely consist of a uniform dielectric material, but should have a smaller dielectric constant than the partial layer I2 adjoining the gate electrode G. Thus, for example, the partial layer I1 of the gate insulator layer as adjoining the semiconductor surface, may consist of $SiO_2$ and the partial layer I2 of the gate insulator layer as adjoining the gate electrode G, may consist of $Si_3N_4$, $Al_2O_3$ or of $Ta_2O_5$.

With a view to the producibility, of course, it is most simple to manufacture all partial layers I1, I2, I3 and I4 of the gate insulator layer from a chemically uniform material, such as $SiO_2$, $Si_3N_4$ or $Al_2O_3$. The deposition of these materials and the manufacture of structures therefrom, can be carried out in the conventional way by employing photolithographic etching processes.

The hitherto known non-volatile semiconductor storage cells comprising storage transistors of the type described hereinbefore, generally all have a so-called conventional hysteresis, at which a negative programming voltage at the gate drives a positive charge into the storage medium Gm and, thus, changes the threshold voltage $U_D$ in the negative direction; conversely, when the programming voltage is positive, a positive charge is driven to the gate electrode. With this conventional hysteresis, the net charge transport takes place between the storage medium and the silicon surface of the channel region.

In storage transmission according to the invention, this is achieved primarily by making the field strength in the inner partial layer I1 adjoining the silicon surface higher than that in the outer partial layer I2 by choosing for the two partial layers I2 and I1 such insulating materials that the material of the partial layer adjoining the gate electrode G has the higher dielectric constant. In practice, the outer partial layer I2 is chosen to be made of $Si_3N_4$ or else of $Al_2O_3$, while the inner partial layer I1 is made of $SiO_2$, so that the inner partial layer will have a dielectric constant of $\epsilon 1/\epsilon 0 = 3.9$, while the outer partial layer I2 has a dielectric constant of $\epsilon 2/\epsilon 0$ of approximately 6.8 or 8.5 respectively. In addition, to increase both the writing and the erasing speed, the inner partial layer I1, made of $SiO_2$, is made so thin that direct tunnelling will take place; this, disadvantageously, however, also results in increased back-tunnelling and, consequently, in a relatively poor retention time.

Figure 2:
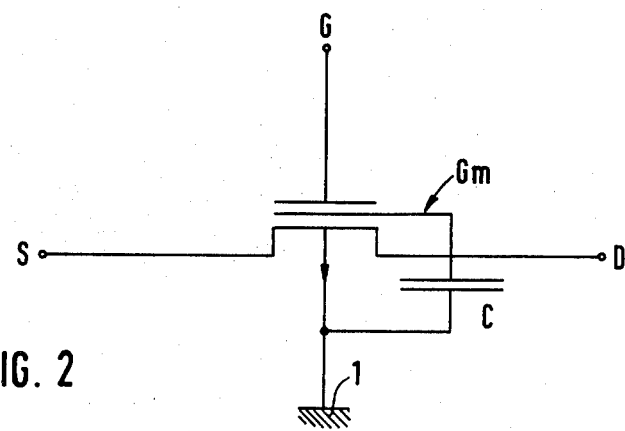
FIG. 2 shows the equivalent circuit diagram of the storage transistor according to the invention.

FIG. 2 shows the equivalent circuit diagram of the storage transistor according to the invention, on which the performed calculation is based. The storage medium Gm is inserted between the gate electrode G and the substrate and is connected to the substrate 1 via an equivalent circuit capacitance C.

The storage transistor according to the invention, however, is also suited for the complementary hysteresis since the parasitic capacitance of the storage medium Gm besides the gate electrode G leads to an increase in the field strength in the partial layer I2 adjoining the gate electrode G, since this partial layer I2 can be made so thin as is just permitted by the required retention time. This makes possible high field strengths in the partial layer I2 with relatively low gate voltages.

The complementary hysteresis can also be realized with a storage transistor according to the invention whose gate insulator layer is made of only one material, e.g. $SiO_2$, in all partial layers. The reversal of the hiterto considered sequence of a partial layer, i.e. a partial layer I2 made of $SiO_2$ and a partial layer I1 made of $Si_3N_4$ will then even result in still better properties.

For the storage medium Gm, with a view to requiring a low as possible programming voltage, there should be used a compact layer of a material with a small electron work function. Suitable materials are polycrystalline silicon, germanium, aluminum arsenide, aluminum antimonide or gallium arsenide, which are all $n^+$-semiconducting materials. Suitable metals for the layer of the storage medium Gm with a low electron work function, are aluminum, gold, titanium, magnesium, tantalum, tungsten, molybdenum, manganese or thallium.

In a complementary hysteresis type storage transistor, also the gate electrode G should be made of a compact layer consisting of the same material as the storage medium Gm.

What is claimed is:

1. A storage transistor, comprising:
   a substrate formed of a semiconductor body having a plane surface;
   a source region formed in said surface;
   a drain region formed in said surface and spaced from the source region forming a channel region therebetween;
   a gate electrode disposed over said channel region;
   a storage medium comprising a layer of semiconducting material, said storage medium having a first portion disposed between the gate electrode and channel region and a second portion extending from between the channel region and gate electrode, the ratio of the surface area of the second portion of the storage medium to the first portion of the storage medium being between 2 and 3;
   a first partial gate insulator layer disposed between the storage medium and the channel region having a thickness ranging between approximately 100 and 200 Å.U.; and
   a second partial gate insulator layer disposed between the storage medium and the gate electrode and having a thickness ranging between approximately 200 and 500 Å.U., whereby a write or erase pulse may be applied to the gate electrode for storing or removing a charge into or from the storage medium respectively thereby displacing the threshold voltage and a read pulse may be applied to the gate electrode for scanning the magnitude of the threshold voltage.

2. A storage transistor as defined in claim 1, wherein the first portion of the storage medium extending between the gate electrode and the channel region extends over a central portion of the channel region spaced from both said source region and said drain region, the surface areas of the channel region adjacent said source and drain regions not under the storage medium being covered by a uniform gate insulator layer between the channel region and the gate electrode.

3. A storage transistor as defined in claim 2, wherein the uniform gate insulator layer has a greater thickness than the total thickness of the two partial gate insulator layers and the embedded storage medium.

4. A storage transistor as described in claim 2, wherein the uniform gate insulator layer has a thickness in the range between approximately 700 and 2,000 Å.U.

5. A storage transistor as defined in claim 1, wherein the first partial gate insulator layer comprises a uniform dielectric material.

6. A storage transistor as defined in claim 1, wherein the first partial gate insulator layer has a lower dielectric constant than the second partial gate insulator layer.

7. A storage transistor as described in claim 6, wherein the first partial gate insulator layer comprises silicon dioxide, and the second partial gate insulator layer is formed of a dielectric selected from the group consisting of $Si_3N_4$, $Al_2O_3$ and $Ta_2O_5$.

8. A storage transistor as defined in claim 1, wherein the first and second partial layers of gate insulator material are each formed of a chemically uniform material.

9. A storage transistor as described in claim 8, wherein the chemically uniform material is selected from at least one of the materials selected from the group consisting of $SiO_2$, $Si_3N_4$ and $Al_2O_3$.

10. A storage transistor as defined in claim 1, wherein the storage medium is a compact layer of a material with a low electron work function.

11. A storage transistor as described in claim 1, wherein the storage medium is selected from the group of $n^+$-type materials consisting of polycrystalline silicon, germanium, aluinum arsenide, aluminum antimonide and gallium arsenide.

12. A storage transistor as defined in claim 10, wherein the storage medium is formed of one of the metals in the group consisting of aluminum, gold, titanium, magnesium, manganese, tantalum, tungsten, molybdenum and thallium.

13. A storage transistor as described in claim 11, wherein the gate electrode is formed of a compact layer of the same materials as that of the storage medium.

14. A storage transistor as described in claim 12, wherein the gate electrode is a compact layer of the same material as that of the storage medium.

* * * * *